United States Patent [19]
Oehrlein et al.

[11] Patent Number: 5,155,657
[45] Date of Patent: Oct. 13, 1992

[54] HIGH AREA CAPACITOR FORMATION USING MATERIAL DEPENDENT ETCHING

[75] Inventors: Gottlieb S. Oehrlein; Vishnubhai V. Patel, both of Yorktown Heights; Alfred Grill, White Plains; Rodney T. Hodgson, Ossining; Gary W. Rubloff, Waccabuc, all of N.Y.

[73] Assignee: International Business Machines Corporation, Armonk, N.Y.

[21] Appl. No.: 785,634

[22] Filed: Oct. 31, 1991

[51] Int. Cl.⁵ .................. H01L 29/68; H01L 21/76; H01G 4/06
[52] U.S. Cl. .................................. 361/313; 357/23.6; 437/52
[58] Field of Search ............... 361/311–313; 357/51, 23.6; 437/52

[56] References Cited

U.S. PATENT DOCUMENTS

| | | | |
|---|---|---|---|
| 4,475,982 | 10/1984 | Lai et al. | 156/643 |
| 4,601,778 | 7/1986 | Robb | 156/628 |
| 4,853,348 | 8/1989 | Tsubouchi et al. | 437/203 |
| 4,906,590 | 3/1990 | Kanetaki et al. | 437/52 |
| 4,943,344 | 7/1990 | Tachi et al. | 156/643 |
| 5,095,346 | 3/1992 | Bae et al. | 357/23.6 |
| 5,102,817 | 4/1992 | Chatterjee et al. | 437/47 |

FOREIGN PATENT DOCUMENTS

| | | |
|---|---|---|
| 59-191333 | 10/1984 | Japan . |
| 60-173871 | 9/1985 | Japan . |
| 60-176265 | 9/1985 | Japan . |
| 60-224261 | 11/1985 | Japan . |

OTHER PUBLICATIONS

P. M. Schaible and G. C. Schwartz, IBM Technical Disclosure Bulletin, vol. 22, No. 5, p. 1819 (Oct. 1979).
P. M. Schaible and G. C. Schwartz, IBM Technical Disclosure Bulletin, vol. 21, No. 7, pp. 2814–2815 (Dec. 1978).

Primary Examiner—Donald A. Griffin
Attorney, Agent, or Firm—Heslin & Rothenberg

[57] ABSTRACT

The invention provides a capacitor having increased capacitance comprising one or more main vertical trenches and one or more lateral trenches extending off the main vertical trench. The capacitor has alternating first and second regions, preferably silicon and non-silicon regions (for example, alternating silicon and germanium or alternating silicon and carbon regions). The etch characteristics of the alternating regions are utilized to selectively etch lateral trenches thereby increasing the surface area and capacitance of the capacitor. A method of fabricating the capacitors is also provided.

34 Claims, 4 Drawing Sheets

HIGH AREA CAPACITOR FORMATION USING MATERIAL DEPENDENT ETCHING

TECHNICAL FIELD

This invention relates to high area capacitors for use in the semiconductor industry, and more particularly to capacitors having lateral trenches extending from a main vertical trench. The lateral trenches are formed by utilizing the etch characteristics of silicon versus non-silicon materials.

BACKGROUND ART

The technology of producing semiconductor devices has been continually pressured to increase effective device densities in order to remain cost competitive. As a result, Very Large Scale Integration (VLSI) and Ultra Large Scale Integration (ULSI) technologies have entered the sub-micron realm of structural dimension and now are approaching physical limits in the nanometer feature size range. In the foreseeable future, absolute atomic physical limits will be reached in the conventional two-dimensional approach to semiconductor device design. Traditionally, dynamic random access memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental or particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has also been severely restricted. Due to decreases in the thickness of capacitor materials, existing 1 Megabit (1 MBit) DRAM technologies utilize a planar device in circuit design. Beginning with 4 MBit DRAMs, the world of three-dimensional design has been explored to the extent that the simple single device/capacitor memory cell has been altered to provide the capacitor in a vertical dimension. In such designs the capacitor has been formed in a trench in the surface of the semiconductor substrate. In yet denser designs, other forms of capacitor design are proposed, such as stacking the capacitor above the transfer device.

The progress of DRAM technology, which in many ways drives micro-electronics technology, is thus currently limited in significant part by the difficulty of fabricating storage capacitors with sufficient capacitance within decreasing area on the chip. The DRAM world is currently divided between two paths, with some manufacturers pursuing trench capacitors built into the crystalline silicon wafer, and other manufacturers pursuing stacked capacitors in which the capacitor is fabricated on top of the wafer surface. The use of a stacked capacitor permits a variety of new process options, for example, in the choice of electrode material (polysilicon, silicide, etc.). In the case of the trench capacitor, its extendibility is in doubt since it is extremely difficult to etch about 0.15–0.25 micrometer wide trenches well over 10 micrometers deep, as well as to then fabricate ultrathin dielectric layers on the trench surface, fill the trench, etc.

A need thus continues to exist in the art for a capacitor having a large surface area so that the capacitor's capacitance is increased, without increasing the area occupied by the capacitor structure on or in a silicon substrate.

DISCLOSURE OF INVENTION

It is thus an object of the invention to provide a capacitor having a large surface area, and therefore increased capacitance as compared to previously available capacitors, without increasing the area occupied by the capacitor structure on or in a silicon substrate.

It is also an object of the subject invention to provide a method for producing such a capacitor.

Briefly described, the present invention comprises capacitors for DRAMs fabricated by depositing alternating layers of material on the surface of a wafer, preferably alternating silicon and non-silicon regions. The etch characteristics of the materials (e.g. silicon and non-silicon regions) forming the alternating layers are exploited to selectively etch one material laterally (e.g. either the silicon or non-silicon regions), while leaving the other material substantially unetched. The resulting lateral trenches provide increased surface area for the capacitor, without increasing the amount of wafer surface occupied by the capacitor.

In one embodiment, the alternating regions comprise successively deposited alternating ultrathin layers of pure polysilicon (Si) and polygermanium (Ge), or a germanium/silicon (Ge/Si) alloy in place of the polygermanium, on the surface of a wafer. The alternating layers are deposited on the surface of a wafer using UHV-CVD, and then anisotropic and isotropic etching are combined to etch the multilayers and form the desired capacitor structure.

Specifically, the multilayer structure is etched to produce patterning to define the central region of a vertical via-like structure (a main vertical trench). The patterning is by highly anisotropic dry etching without sidewall passivation. The exposed layers' sidewalls are then etched laterally using a selective isotropic etch chemistry to attack the Si or the Ge or Ge/Si. The resulting fin-like stacked capacitor shapes are subjected to conformal dielectric deposition and subsequent via filing to create the capacitor device.

In a further embodiment, the alternating ultrathin layers comprise heavily doped polysilicon and carbon (C). The carbon layers are completely etched away using an oxygen plasma so as to form lateral trenches, thereby increasing the surface area of the capacitor and therefore the capacitor's capacitance.

BRIEF DESCRIPTION OF DRAWINGS

The foregoing and other objects, features and advantages of the invention will be apparent from the following more particular description of preferred embodiments of the invention as illustrated in the accompanying drawings in which.

2a deposition of a multilayer doped polySi-Carbon structure.

BEST MODE FOR CARRYING OUT THE INVENTION

Figure 1A:
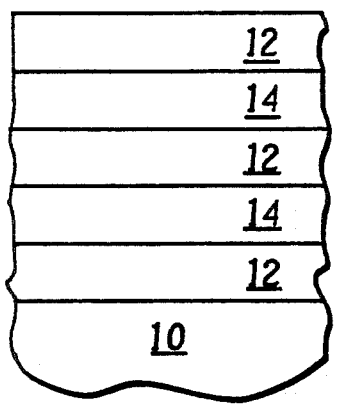
FIG. 1 generally illustrates in cross section the fabrication of a high area structure for DRAM stacked capacitor application; showing, more particularly, in FIG. 1a deposition of a multilayer polySi-polyGe structure.
in FIG. 1b vertical etching through the multilayer structure.
in FIG. 1c lateral selective etching of Ge; and in FIG. 1d the alternative of lateral selective etching of Si.

As used in the subject application, doping refers to the addition of impurities to a semiconductor material. Doping allows the manufacture of n-type and p-type semiconductors with varying degrees of conductivity. In general, the greater the extent of doping, the higher the conductivity.

An n-type material refers to a semiconductor material that has been doped with a donor-type impurity and, consequently, conducts a current via electrons. A p-type material refers to a semiconductor material that has been doped with an acceptor-type impurity and, consequently, conducts current via hole migration.

Etching refers to chemically eating away a material to form a desired pattern as an etched circuit; for example, an etched circuit can be produced by etching the material coating of a substrate to provide the required pattern of conductors and terminals to which discrete components are soldered. Selectively etching refers to the use of etching, for example, in the manufacturer of circuits, to remove selected portions of one material from another in a semiconductor or capacitor structure.

Isotropic etching is a process whereby the etch rate is substantially the same in the horizontal and vertical directions with respect to the horizontal wafer surface. Anisotropic etching is the process where the etch rate is substantially different in two different directions, determined, for example, by the plasma wafer interface or the silicon crystal axis.

A capacitor refers to a passive electronic circuit component consisting of, in basic form, two conducting electrodes or plates separated by a dielectric (or insulator). The capacitance of a capacitor, measured in farads, measures the charge that may be stored in a capacitor per unit of voltage applied between the electrodes of the capacitor. A trench capacitor refers to a capacitor formed in a vertical trench formed in the horizontal surface of a semiconductor substrate. A stacked capacitor refers to a capacitor formed by stacking the capacitor above the semiconductor substrate. In a capacitor, a lateral trench (or horizontal trench) refers to a trench extending horizontally from a vertical trench situated in the capacitor device.

RIE refers to reactive ion etching. ECR refers to electron cyclotron resonance etching. Passivation refers to the process of growing or depositing a thin oxide or other insulating film on the surface of a planar semiconductor device to protect the exposed junction(s) from contamination and shorts, with sidewall passivation referring to this process in relation to sidewalls.

CVD refers to chemical vapor deposition, in which a chemical reaction in a gas or at a gas surface interface deposits solid material at the gas surface interface. Ion implantation refers to the implantation of ions, for example, for doping a semiconductor substrate.

Epitaxial growth refers to growing monocrystalline material on the surface of a monocrystalline material, herein exemplified by growing monocrystalline silicon on a silicon wafer by depositing silicon from a silicon-containing source (e.g. SiH$_4$, "silane") onto a wafer in a chamber in which temperature, atmosphere, flow and geometry are carefully controlled.

Epitaxy refers to the condition in which atoms in a thin film of single crystal material grown on the surface of a crystalline material shows substantially perfect registration of the two crystal lattices. The atoms in an epitaxial silicon film are arranged in a perfect array that is the same as the perfect array of the underlying silicon, and therefore exhibit an inherent symmetry in arrangement and orientation.

Silicon, as used in this application, includes polysilicon (polycrystalline silicon), amorphous silicon (non-crystalline silicon), and microcrystalline silicon, unless otherwise indicated. Germanium preferably comprises polygermanium, amorphous germanium, and microcrystalline germanium; carbon preferably comprises diamond carbon, which exhibits a preponderance of sp$_3$ hybridized bonds between the carbon atoms.

The broad concept of the subject invention is directed to a capacitor comprising one or more main vertical trenches and one or more lateral trenches extending off the main vertical trenches. The capacitor has (or has been formed from) alternating first and second regions of material (preferably silicon and non-silicon regions) through which the main vertical trenches extend. The lateral trenches of the capacitor result from selective lateral etching of either the first or second region, and is accomplished due to the first region of material having different etch characteristics from the second region of material. At least one of the first and second regions of the capacitor comprises a non-silicon region.

The capacitor may be a trench capacitor or a stacked capacitor. In a stacked capacitor of the subject invention, the alternating regions preferably comprise alternating layers of the silicon and non-silicon regions.

The alternating silicon and non-silicon regions are chosen so as to result in different etch characteristics of the two regions, so that one region can be selectively etched without etching the other region. Preferred combinations of silicon and non-subject silicon regions are silicon and germanium regions, silicon and germanium/silicon alloy regions, and silicon and carbon regions.

Depending upon the etch characteristics desired, the silicon may be doped or undoped silicon. Doped silicon can be p-doped silicon, such as silicon doped with boron, or n-doped silicon, such as silicon doped with arsenic or phosphorus.

In one embodiment, the invention provides a capacitor stacked upon a wafer surface of a semiconductor device. The capacitor comprises one or more multilayered cells and one or more main vertical trenches. The main vertical trenches surround the multilayered cells. Each multilayered cell comprises a vertical region of doped polysilicon and one or more lateral trenches extending off the main vertical trench surrounding the multilayered cell. The lateral trenches lie between layers of doped polysilicon. The capacitor can further comprise a top layer of doped polysilicon overlying the multilayered cell(s) and extending into the main vertical trenches. Furthermore, the layers of doped polysilicon between which the lateral trenches are located can be coated with a dielectric. This dielectric coating can be formed by oxidizing the doped polysilicon or by depositing an oxide layer (for example, by chemical vapor deposition). A conducting layer, such as a metal layer, can be applied over the top layer of doped polysilicon in order to connect all devices of the capacitor structure.

This embodiment of the capacitor of the subject invention can be incorporated into a semiconductor device which also includes transistor devices. A transistor device is situated under each multilayered cell of the capacitor and an oxide layer overlies the transistor device, between the semiconductor wafer surface and the multilayered cells. The top layer of doped polysilicon functions as an electrode for the capacitor of the semiconductor device.

The invention also provides a method of increasing the capacitance of a capacitor. The method comprises forming a capacitor having alternating first and second regions of material (preferably silicon and non-silicon regions), and then etching one or more main vertical trenches in the capacitor by etching vertically through the first and second regions. One or more lateral trenches are then etched off from the main vertical trenches by selectively laterally etching either the first or second regions. The first and second regions have different etch characteristics, allowing for this selective lateral etching, with at least one of the regions being a non-silicon region. These lateral trenches increase the surface area of the capacitor, thereby increasing the capacitance of the capacitor.

Any suitable means of etching known to those skilled in the art can be utilized to fabricate the capacitor. Such etching can be dry etching or wet etching, and the choice of first and second (e.g. silicon and non-silicon regions) will dictate in part suitable etching means. Examples of dry etching include isotropic dry etching, such as reactive ion etching, with or without sidewall passivation. ECR is also a suitable etching means. Examples of suitable etchant gases, also known to those skilled in the art, are $SF_6$ for etching silicon, $CF_4/H_2$ for etching germanium, and oxygen for etching carbon.

It is also possible to etch a main vertical trench simultaneously with the etching of the lateral trenches, such as by using chlorine chemistry.

These aspects of the invention will be more readily understood by the examples of preferred embodiments which follow.

EXAMPLE 1

In one embodiment, the invention provides a high area stacked capacitor which is formed using alternating Si and Ge layers, and isotropic/anisotropic dry etching. The formation of high area/density stacked capacitor structures is enabled by exploiting: (i) low temperature deposition of alternating Si and Ge layers; and (ii) alternating anisotropic and isotropic dry etching processes to fabricate a stacked capacitor.

Specifically, the stacked capacitor structure is formed by combining anisotropic and isotropic etching of Si-Ge multilayers. As indicated in FIG. 1a, alternating layers of pure polysilicon 12 and polygermanium 14 are deposited on the surface of the wafer 10. The individual layers are fabricated as ultrathin structures (e.g., about 300–500 Å,) using low temperature ultrahigh vacuum chemical vapor deposition (UHV/CVD) processing, which permits the deposition of high quality Si—Ge concentration profiles at temperatures ($\geq 450°$ C.) without thermal smearing. These ultrathin layers later translate into high area stacked capacitor structures.

Figure 1B:
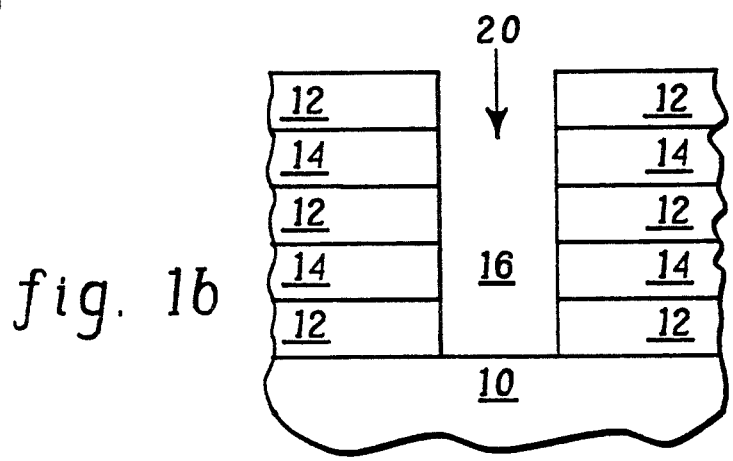

Deposition of the multilayer structure is then followed by patterning to define a main vertical trench 16 in the multilayer structure. Using patterns which incorporate minimum feature sizes characteristic of the technology generation, this main vertical trench 16 is formed using highly anisotropic dry etching 20 (such as reactive ion etching) without use of sidewall passivation, as shown in FIG. 1b.

Figure 1C:
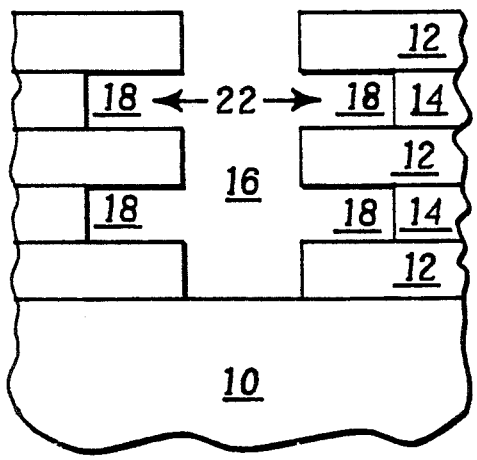
Figure 1D:
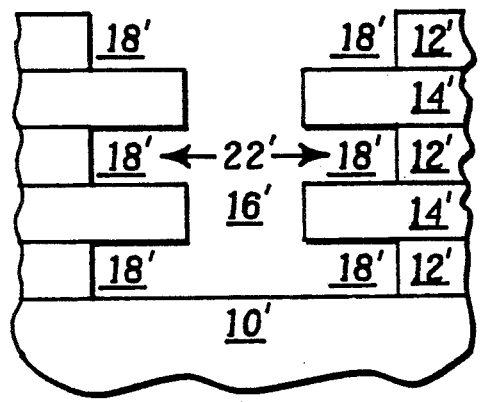

Next alternating layers of the multilayer structure are etched laterally using an isotropic etch chemistry which selectively attacks either the Si or the Ge material, as depicted in FIG. 1c and FIG. 1d. In FIG. 1c, the Ge 14 is etched laterally at 22 to form lateral trenches 18 off the main vertical trench 16. In FIG. 1d, the Si 12' is etched laterally at 22' to form lateral trenches 18' off the main vertical trench 16'. Suitable exemplary etchants would be $CF_4/H_2$ for selectively etching Ge and not Si, or $SF_6$ for selectively etching Si and not Ge.

This lateral etching step provides a considerably larger surface area for the structure, which leads to higher capacitance per unit chip area than could be achieved merely by lithographic definition at a given minimum feature size.

It is also possible to combine the vertical and lateral etching by an appropriate choice of etch chemistry.

Following the combination of anisotropic and selective isotropic etching to form fin-like stacked capacitor shapes, conformal dielectric deposition and subsequent via filling (e.g., polySi CVD) are used to create the capacitor device as commonly done in DRAM technology.

Alternative embodiments could involve the use of amorphous or microcrystalline Si and/or Ge layers instead of polycrystalline material, where deposition could be thermal CVD or plasma-enhanced CVD. If sufficient selectivity could be achieved, SiGe alloy layers might be employed in place of the Ge layers. Finally, one could utilize selective Si/Ge epitaxy to grow single-crystal Si films above the wafer surface at low temperature ($\geq 600°$ C.) in order to obtain better control over processing issues associated with grain boundary structures in polySi, etc.

EXAMPLE 2

Figure 2A:
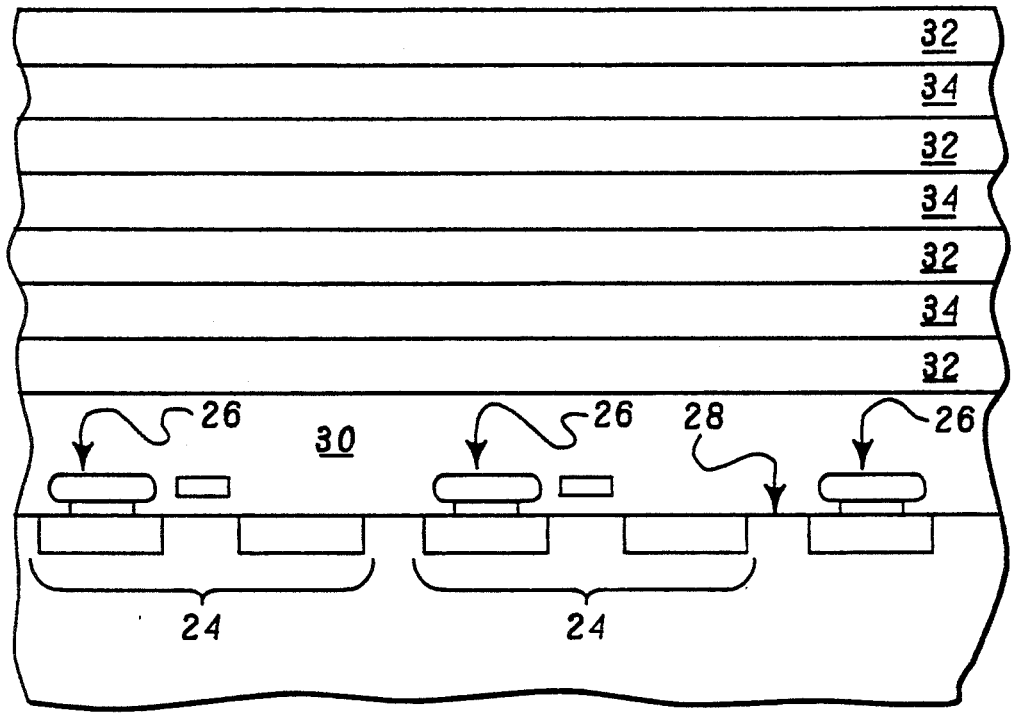
FIG. 2 generally illustrates in cross section the fabrication of a high area structure for DRAM stacked capacitor application; showing, more particularly, in FIG.
in FIG. 2b opening of holes through this multilayer structure.
in FIG. 2c filling of the holes with heavily doped polysilicon.
in FIG. 2d vertical etching through the heavily doped polysilicon and lateral selective etching of the carbon; and in FIG. 2e formation of a dielectric coating which is covered with heavily doped polysilicon and then a further layer of conducting material.

In another embodiment, the invention provides a high area stacked capacitor which is formed using alternating carbon and silicon layers. This embodiment utilizes the tremendous etch rate ratio of carbon, particularly diamond carbon, and silicon to fabricate stacked capacitors as shown in FIG. 2. After the transistor devices 24 with their associated lines 26 are made, the entire wafer surface 28 is covered with a relatively thick layer of oxide 30, and the oxide is planarized by means known in the art. A layer of heavily doped polysilicon 32 is then laid down on oxide layer 30 and subsequently a series of alternating carbon 34 and polysilicon 32 layers are deposited as shown in FIG. 2a.

Figure 2B:
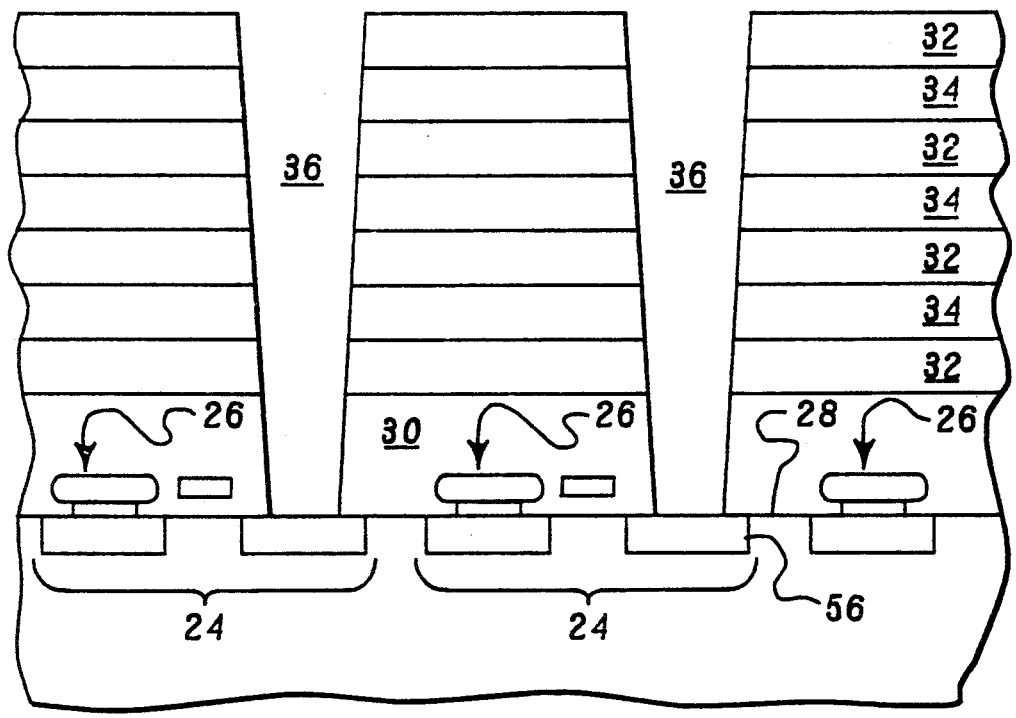
Figure 2C:
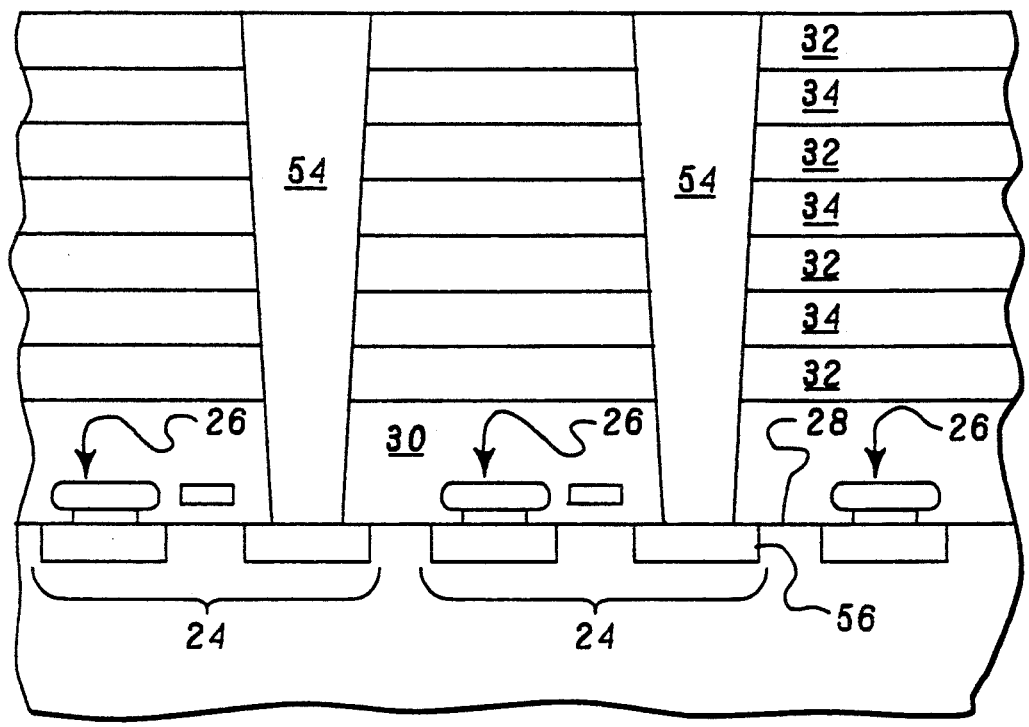
Figure 2D:
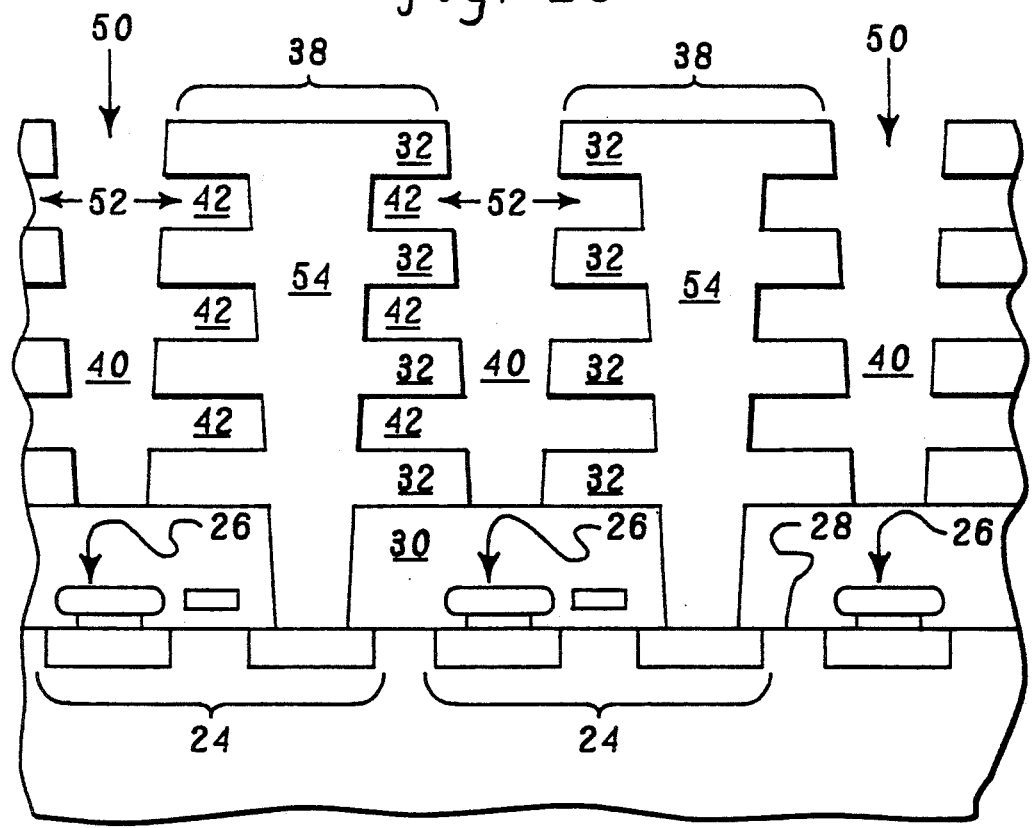

Holes 36 are opened down through the alternating carbon 34 and polysilicon 32 layers to the thick oxide layer 30, and the oxide 30 is etched down to the conducting connection 56 on the surface 28 of the device to form multilayered cells 38 above the transistor devices 24 (see FIG. 2b and FIG. 2d). The holes 36 are filled with heavily doped (conducting) polysilicon 54 and planarized back to the surface of the original stack as shown in FIG. 2c.

Main vertical trenches 40 are then etched 50 in the carbon 34 and polysilicon 32 layers down to the oxide 30 to delineate cells 38, and all the carbon 34 layers are horizontally etched 52 out with an oxygen plasma so as to form lateral trenches 42 as shown in FIG. 2d.

Figure 2E:
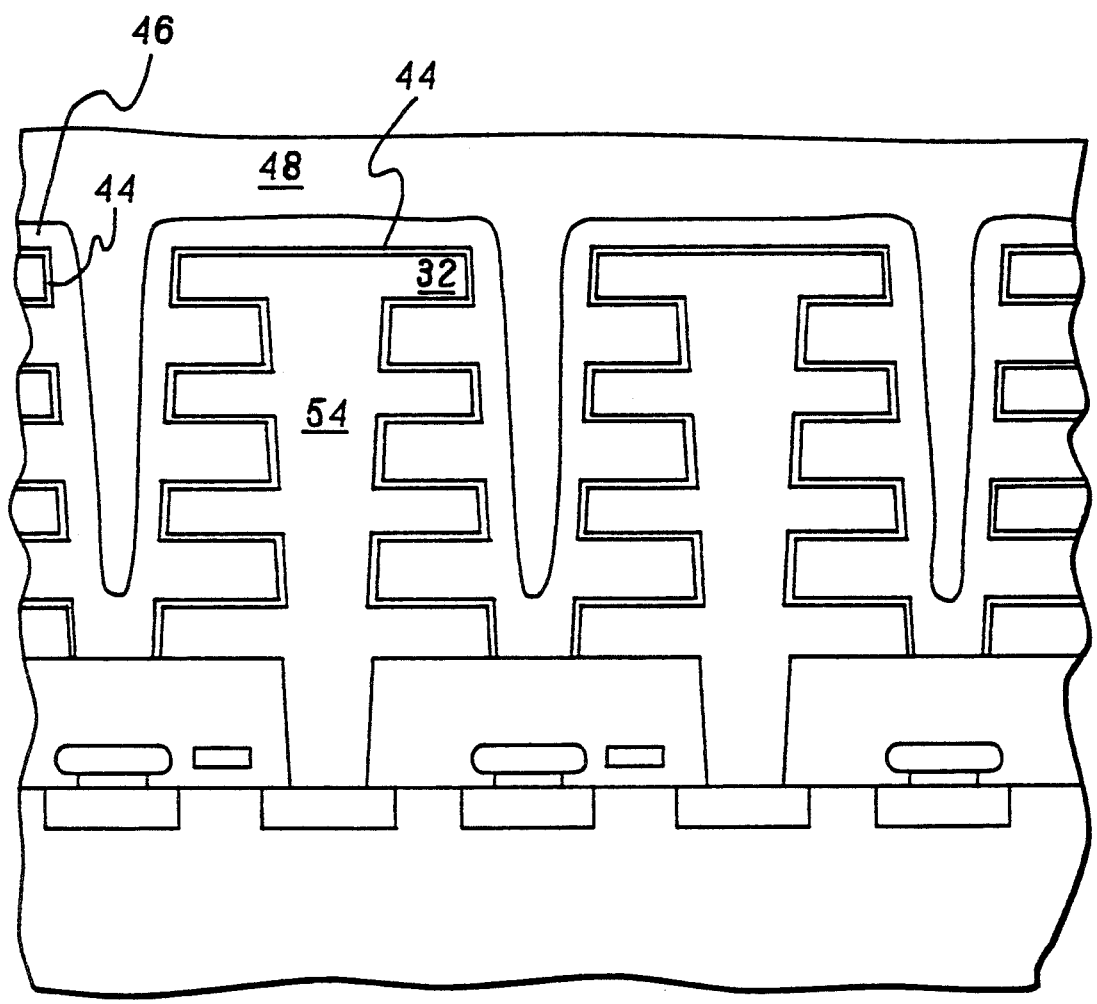

The entire surface of the polysilicon 32 is oxidized to form a dielectric coating 44 for the stack capacitor. Then, the entire surface of the dielectric 44 is covered with heavily doped conducting polysilicon 46 to act as an electrode for the capacitor as shown in FIG. 2e. A conducting layer 48 can be added to connect all the devices with a low resistivity path to ground.

The resulting capacitor structure, when viewed from the top, has polysilicon studs forming the centers of multilayered cells. The multilayered cells comprise these polysilicon studs and the lateral trenches which extend from the polysilicon studs to the vertical trench surrounding the multilayered cell. The lateral trenches occupy the space previously occupied by the diamond-like carbon. Thus, the lateral trenches are located between polysilicon layers, just as the carbon layers previously were. These polysilicon layers are continuous with the polysilicon studs.

While the invention has been particularly shown and described with reference to preferred embodiments thereof, it will be understood by those skilled in the art that various changes in form and details may be made therein without departing from the spirit and scope of the invention.

We claim:

1. A capacitor comprising:
one or more main vertical trenches and one or more lateral trenches extending off each of said one or more main vertical trenches, said capacitor having alternating first and second regions of material through which said one or more main vertical trenches extend, said first region of material having different etch characteristics from said second region of material, and at least one of said first and second regions comprising a non-silicon region.

2. The capacitor of claim 1 wherein said first and second regions of material comprise a silicon region and a non-silicon region.

3. The capacitor of claim 2 wherein said capacitor comprises a trench capacitor.

4. The capacitor of claim 2 wherein said capacitor comprises a stacked capacitor.

5. The capacitor of claim 4 wherein said alternating regions comprise alternating layers of said silicon and non-silicon regions.

6. The capacitor of claim 2 wherein said non-silicon comprises germanium.

7. The capacitor of claim 2 wherein said non-silicon comprises a germanium/silicon alloy.

8. The capacitor of claim 2 wherein said silicon region of said capacitor comprises doped silicon.

9. The capacitor of claim 8 wherein said doped silicon comprises p-doped silicon.

10. The capacitor of claim 8 wherein said doped silicon comprises n-doped silicon.

11. The capacitor of claim 9 wherein said p-doped silicon comprises silicon doped with boron.

12. The capacitor of claim 10 wherein said n-doped silicon comprises silicon doped with arsenic or phosphorus.

13. A capacitor comprising:
one or more main vertical trenches and one or more lateral trenches extending off each of said one or more main vertical trenches, said capacitor having been formed from alternating first and second regions of material through which said one or more main vertical trenches extend, said first region of material having different etch characteristics from said second region of material, and at least one of said first and second regions comprising a non-silicon region.

14. The capacitor of claim 13 wherein said non-silicon comprises carbon.

15. A method of increasing the capacitance of a capacitor which comprises:
forming a capacitor having alternating first and second regions of material, said first region of material having different etch characteristics from said second region of material, and at least one of said first and second regions comprising a non-silicon region;
etching one or more main vertical trenches in said capacitor by etching vertically through said first and second regions of material; and
etching one or more lateral trenches off said one or more main vertical trenches by selectively laterally etching one of said first and second regions, thereby increasing surface area of said capacitor so as to increase capacitance of said capacitor.

16. The method of claim 15 wherein said first and second regions of material comprise a silicon region and a non-silicon region.

17. The method of claim 15 wherein said etching of said one or more main vertical trenches comprises dry etching.

18. The method of claim 17 wherein said dry etching of said one or more main vertical trenches comprises anisotropic dry etching.

19. The method of claim 18 wherein said anisotropic dry etching comprises reactive ion etching.

20. The method of claim 19 wherein said reactive ion etching comprises reactive ion etching without sidewall passivation.

21. The method of claim 15 wherein said etching of said one or more main vertical trenches comprises wet etching.

22. The method of claim 15 wherein said etching of said one or more lateral trenches comprises dry etching.

23. The method of claim 22 wherein said dry etching of said one or more lateral trenches comprises isotropic dry etching.

24. The method of claim 15 wherein said etching of said one or more lateral trenches comprises wet etching.

25. The method of claim 15 wherein said lateral etch comprises etching with $SF_6$.

26. The method of claim 15 wherein said lateral etch comprises etching with $CF_4/H_2$.

27. The method of claim 15 wherein said lateral etch comprises etching with oxygen.

28. The method of claim 15 wherein said etching of said one or more main vertical trenches is simultaneous with said etching of said one or more lateral trenches.

29. A capacitor stacked upon a wafer surface of a semiconductor device, said capacitor comprising:
one or more multilayered cells; and
one or more main vertical trenches surrounding each of said one or more multilayered cells;
wherein each of said one or more multilayered cells comprises a vertical region of doped polysilicon and one or more lateral trenches extending off one of said surrounding main vertical trenches between layers of doped polysilicon, each of said one or more multilayered cells having been formed from alternating first and second regions of material through which said one or more main vertical trenches extend, said first region of material having different etch characteristics from said second region of material, and at least one of said first and second regions comprising a non-silicon region.

30. The capacitor of claim 29 wherein said layers of doped polysilicon have a dielectric coating thereon.

31. The capacitor of claim 30 wherein said dielectric coating is formed by oxidation of said layers of doped polysilicon.

32. The capacitor of claim 30 wherein said dielectric coating is formed by chemical vapor deposition of an oxide layer.

33. The capacitor of claim 29 further including a top layer of doped polysilicon overlying said one or more multilayered cells and extending into said one or more main vertical trenches.

34. A semiconductor device comprising the capacitor of claim 31 wherein each of said one or more multilayered cells of said capacitor overlies an oxide layer which overlies a transistor device, said transistor device having associated lines, and wherein said top layer of doped polysilicon functions as an electrode for said capacitor.

* * * * *

UNITED STATES PATENT AND TRADEMARK OFFICE
CERTIFICATE OF CORRECTION

PATENT NO. : 5,155,657

DATED : October 13, 1992

INVENTOR(S) : Gottlieb S. Oehrlein et al.

It is certified that error appears in the above-identified patent and that said Letters Patent is hereby corrected as shown below:

Column 10:
In claim 34, line 2, change "of claim 31" to --of claim 33--

Signed and Sealed this

Twenty-first Day of September, 1993

Attest:

BRUCE LEHMAN

*Attesting Officer* — *Commissioner of Patents and Trademarks*